United States Patent
Oka

(10) Patent No.: US 6,524,113 B1
(45) Date of Patent: Feb. 25, 2003

(54) AUTOMOBILE JUNCTION BOX WITH REPLACEABLE BUSBAR CIRCUIT BLOCKS

(75) Inventor: Yoshito Oka, Yokkaichi (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 0 days.

(21) Appl. No.: 09/628,323

(22) Filed: Jul. 28, 2000

(30) Foreign Application Priority Data

Jul. 30, 1999 (JP) ............................................. 11-216727

(51) Int. Cl.[7] ................................................ H01R 29/00
(52) U.S. Cl. .......................................... 439/48; 439/949
(58) Field of Search ................................ 439/76.2, 949, 439/44, 48

(56) References Cited

U.S. PATENT DOCUMENTS

| | | | |
|---|---|---|---|
| 2,977,672 A | | 4/1961 | Telfer .......................... 439/43 |
| 4,445,737 A | * | 5/1984 | Long et al. .................... 439/44 |
| 5,057,026 A | | 10/1991 | Sawai et al. ............... 439/76.2 |
| 5,513,077 A | * | 4/1996 | Stribel ........................ 361/794 |
| 5,604,332 A | | 2/1997 | Ikeda et al. |
| 5,624,280 A | | 4/1997 | Kato |
| 6,270,361 B1 | * | 8/2001 | Onizuka et al. ........... 439/76.2 |
| 6,290,509 B1 | * | 9/2001 | Hattori ....................... 439/949 |
| 6,443,737 B2 | * | 9/2002 | Kasai .......................... 439/44 |

FOREIGN PATENT DOCUMENTS

| | | |
|---|---|---|
| EP | 0259897 | 3/1988 |
| EP | 0445759 | 9/1991 |
| EP | 0926934 | 6/1999 |
| JP | 56130989 | 10/1981 |

* cited by examiner

*Primary Examiner*—Neil Abrams
(74) *Attorney, Agent, or Firm*—Greenblum & Bernstein, P.L.C.

(57) ABSTRACT

An electrical connector housing or automobile junction box is provided that forms internal circuits in a simplified way. The electrical connector housing includes at least one case which is to receive a plurality of circuit blocks, or layers, each of which includes at least one X-directional bus bar layer and at least one Y-directional bus bar layer superposed thereon. The X-directional and Y-directional bus bar layers contain strip-shaped bus bars laminated with insulative film. The strip-shaped bus bars are arranged in parallel at a given interval, respectively in an X direction and in a Y direction perpendicular thereto. The plurality of circuit blocks or layers are then superposed on one another with insulator plates interposed therebetween, such that the bus bars arranged in the X and Y directions form cross points. The cross points are electrically connected to circuits at desired cross points, for example by rivets or pins, so as to form branched circuits. The bus bars in the X and Y directions have folded end portions to form tabs for connection to external circuitry. A power block, current block and splice block may be included and may be individually replaced.

14 Claims, 5 Drawing Sheets

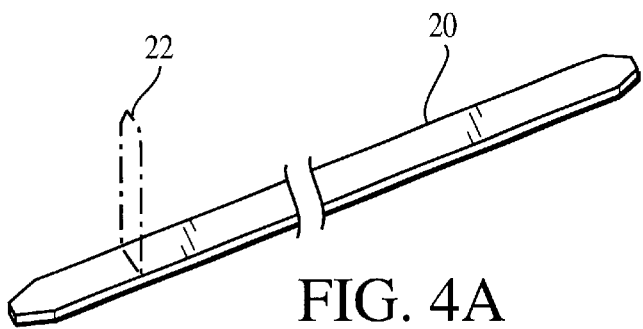
FIG. 4A
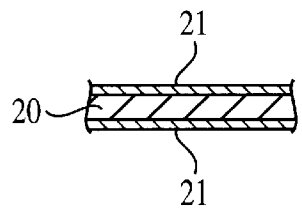
FIG. 4B
FIG. 5A
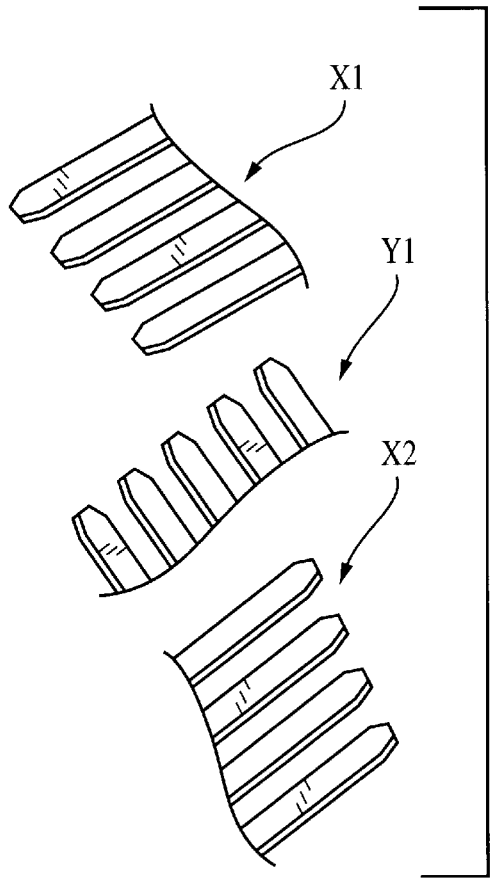
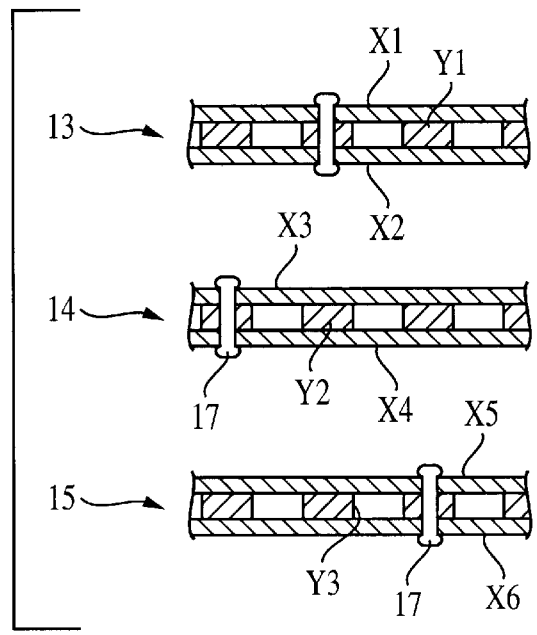
FIG. 5B
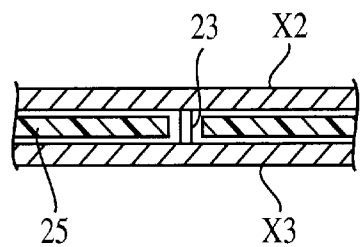
FIG. 6

AUTOMOBILE JUNCTION BOX WITH REPLACEABLE BUSBAR CIRCUIT BLOCKS

BACKGROUND OF THE INVENTION

1. Field of the Invention

The present invention relates to an electrical connector housing used in automobiles. More particularly, the invention concerns bus bars used as internal circuits of the electrical connector housing. According to the invention, these bus bars are manufactured in a simple way, without recourse to a traditional method of stamping out circuit-shaped bus bar through a die.

2. Description of Background Information

The internal circuits of an electrical connector housing, such as a junction box used in automobiles, mainly make use of bus bars formed in circuit shapes. Such bus bars are stamped out from an electrically conductive metal sheet through a die. Besides the approach involving the use of bus bars, there exists another approach in which electrical cables are wired along circuitry on an insulator sheet, and are then press-connected through press-fit terminals by clamping (press-connection system). These two approaches may also be applied in combination.

However, recent developments in this field have brought about an increase in the number of electrical parts equipped and the number of circuits used in an electrical connector housing. The shape of insulator sheets used for cable wiring has also become more complex than in the past. Under such circumstances, if the press-connection system is used for wiring the internal circuits, more time and costs will be consumed for cable wiring and insulator-sheet manufacturing.

If bus bars are used for internal circuits, respective stamping dies have to be prepared for the different circuits produced. Under such conditions, circuit changes will not be responded to as quickly as desired. In addition, the die manufacturing processes incur high costs. Moreover, as the stamping process leaves important portions of unused sheet, the product yield of a conductive metal sheet will be considerably low. As a result, the manufacturing cost of the bus bars is relatively high. Further, as the number of circuits used in an electrical connector housing increases, the number of bus bars required also increases. Nowadays, seven or eight pieces of bus bars must sometimes be superposed in multiple layers. At the same time, corresponding insulator sheets must be interposed therebetween. Such a structural feature therefore tends to increase the total costs.

In view of the above problem, a circuit sheet 2 shown in FIGS. 1A and 1B has been used to implement an electrical connector housing (Japanese Patent Application published under SHO 56-130989). According to the disclosure in this patent application, a conductive metal sheet is stamped out so as to yield cut-off portions 3a and a checkered conductive sheet 3. Two faces of the checkered conductive sheet 3 are then laminated with insulator sheets 1a and 1b. Thereafter, unnecessary circuit paths 3b are cut off so as to form a desired circuit. The checkered conductive sheet 3 is then encircled by electrical cables, and led to external circuits.

As a circuit is formed by cutting off unnecessary circuit paths 3b, the circuit can be modified quickly. However, as checkered circuits are formed by stamping, i.e. by removing many cut-off portions 3a, the product yield from the conductive metal sheet is rather low. Further, an electrical connector housing, e.g. an automobile junction box, requires many circuits such as power-source circuits located upstream of the fuses, load circuits located downstream of the fuses, and circuits unconnected to the fuses. Consequently, the number of bus bar layers becomes large, thereby increasing production costs.

In view of the above, a first object of the invention is to provide an electrical connector housing in which circuits can be formed by unit blocks. A second object of the invention is to reduce the costs of forming internal circuits. A third object of the invention is to be able to respond quickly to changes of internal circuits.

SUMMARY OF THE INVENTION

To this end, there is provided an electrical connector housing including at least one housing case including one or more outwardly projecting connector-fitting portions, fuse-fitting portions and/or relay-fitting portions. The at least one housing case includes a plurality of circuit blocks, each of the circuit blocks including at least one X-directional bus bar layer and at least one Y-directional bus bar layer superposed thereon. The X-directional and Y-directional bus bar layers contain strip-shaped bus bars and an insulator sheet. The strip-shaped bus bars are arranged in parallel at a given interval, respectively in X direction and Y direction perpendicular thereto. The plurality of circuit blocks are then superposed on one another with an insulator plate interposed therebetween, such that the bus bars arranged in the X and Y directions from cross points. The cross points are then electrically connected to each other at desired cross points so as to form branched circuits, while the bus bars in the X and Y directions have bent end portions to form tabs, and the tabs are contained in the connector-fitting portions, fuse-fitting portions and/or relay-fitting portions.

In the bus bars arranged respectively in the X and Y directions, required circuits are formed by removing unnecessary paths in the circuits. In such a structure, strip-shaped bus bars having a given size can be used for both the X and Y directions. The bus bars can thus be prepared uniformly, and production costs can be reduced.

As the electrically conducting portions constituting the internal circuits are all made of strip-shaped bus bars, a common material can be used. The efficiency in the use of material and yield are thus improved. Further, the stamping process using dies, hitherto necessary for making bus bars, can be obviated, thereby greatly reducing circuit-production costs.

The strip-shaped bus bars are arranged in parallel, at a given pitch, in X and Y directions. This pitch can be chosen such as to correspond to the pitch between the terminal holes for the connector, fuse or relay. For instance, some of the bus bars arranged in parallel in the X direction are disposed so as to correspond to the pitch between the fuses, while the remainder thereof are disposed so as to correspond to the pitch between the relays. Likewise, some of the bus bars arranged in parallel in the Y direction, perpendicular to the X direction, are disposed so as to correspond to a small pitch between the connector terminal holes, while some other bus bars are disposed so as to correspond to a median pitch, and the remainder of the bus bars are disposed so as to correspond to a large pitch.

When the bus bars are arranged crosswise in the X and Y directions at a pitch corresponding to that between the terminal holes of the connectors, fuses and relays, the tabs formed by folding these bus bars can be connected to the connectors, fuses and/or relays directly.

When the X-directional layer and the Y-directional layer, respectively including strip-shaped bus bars, are superposed to form more than two layers, desired circuit blocks can be formed preliminarily in a simple way. By changing the combination of blocks or combinations inside a block, circuits can be changed easily. Further, when the circuits are formed by blocks, the strip-shaped bus bars can be designed to have the same width, as a function of required current intensities. The circuits can thus be formed simply as a unit of block. Furthermore, the circuits can be assembled by blocks in the electrical connector housing, so that the assembly efficiency can be improved.

The plurality of circuit blocks include one or more power-source circuit blocks located upstream of the fuses, one or more load-circuit blocks located downstream of the fuses and one or more splice-circuit blocks unconnected to the fuses. Further, the power-source circuit block(s), load-circuit block(s) and splice-circuit block(s) has (have), respectively, a broad width suitable for high current circuits, a medium width suitable for medium current circuit, and a narrow width suitable for weak or mini current circuit.

Accordingly, a power-source-circuit block, a load-circuit block and a splice-circuit block are formed by combining the X-directional bus bar layer and the Y-directional bus bar layer. A required circuit can thus be formed simply by assembling these blocks.

The bus bars have first and second faces laminated with a respective insulator resin sheet. The bus bars, arranged respectively in the X and Y directions, are connected to each other by riveting or welding at the cross points. The bus bars contained in different blocks are then connected to one another by interposing a pin with two edges in a position perpendicular to the bus bars, and welding the two edges thereto.

As the bus bars are coated with insulator resins, there is no need to interpose an insulator plate between the X-directional and the Y-directional bus bar layers. Accordingly, when the blocks are mounted in the electrical connector housing, only the zones between the blocks are to be interposed with an insulator plate. Compared to the past practice in which all the bus bar layers are interposed by an insulator plate, the present invention enables the number of insulator plates to be reduced. As a result, costs are reduced, and the electrical connector housing can be miniaturized.

In another aspect of the present invention, a method of making an electrical connector housing is provided. The method includes providing at least one housing case including at least one of outwardly projecting connector-fitting portions, fuse-fitting portions and relay-fitting portions; the at least one housing case comprising a plurality of circuit blocks, providing each of the circuit block with at least one X-directional bus bar layer and at least one Y-directional bus bar layer superposed thereon, the X-directional and Y-directional bus bar layers containing strip-shaped bus bars and an insulator sheet. The method also includes arranging the strip-shaped bus bars in parallel at a given interval, respectively in an X direction and in a Y direction perpendicular thereto, superposing the plurality of circuit blocks on one another and interposing an insulator plate therebetween such that the bus bars arranged in the X and Y directions form cross points, and electrically connecting selected ones of the cross points to each other to form branched circuits. The method may further include bending end portions of the bus bars in the X and Y directions to form tabs, and inserting the tabs into respective ones of the connector-fitting portions, fuse-fitting and relay-fitting portions.

In a further aspect of the invention, the method includes providing the plurality of circuit blocks to include at least one power-source circuit block located upstream of fuses, at least one load-circuit block located downstream of the fuses and at least one splice-circuit block unconnected to the fuses, and providing the power-source circuit blocks, load-circuit blocks and splice-circuit blocks with, respectively, a broad width suitable for high current circuitry, a medium width suitable for medium current circuitry, and a narrow width suitable for weak or mini current circuitry.

According to other aspects of the present invention, the method may further include laminating first and second faces of each the bus bar with an insulator resin sheet, connecting the bus bars arranged respectively in the X and Y directions to each other by at least one of riveting and welding at the cross points, and connecting the bus bars contained in different blocks to one another by interposition of a pin with two edges in a position perpendicular to the bus bars, and welding the two edges thereto.

BRIEF DESCRIPTION OF THE DRAWINGS

The above and the other objects, features and advantages will be made apparent from the following description of the preferred embodiments, given as non-limiting examples, with reference to the accompanying drawings, in which:

FIGS. 4A and 4B are, respectively, a perspective view and a cross-sectional view of a bus bar;

FIG. 5A is an exploded perspective view of a circuit block having X-directional and Y-directional bus bar layers;

FIG. 5B is a cross-sectional view of the circuit block of FIG. 5A when they are assembled and electrically connected;

FIG. 6 is a schematic view showing how the bus bars are connected between different circuit blocks;

DETAILED DESCRIPTION OF THE PREFERRED EMBODIMENTS

Figure 1A:
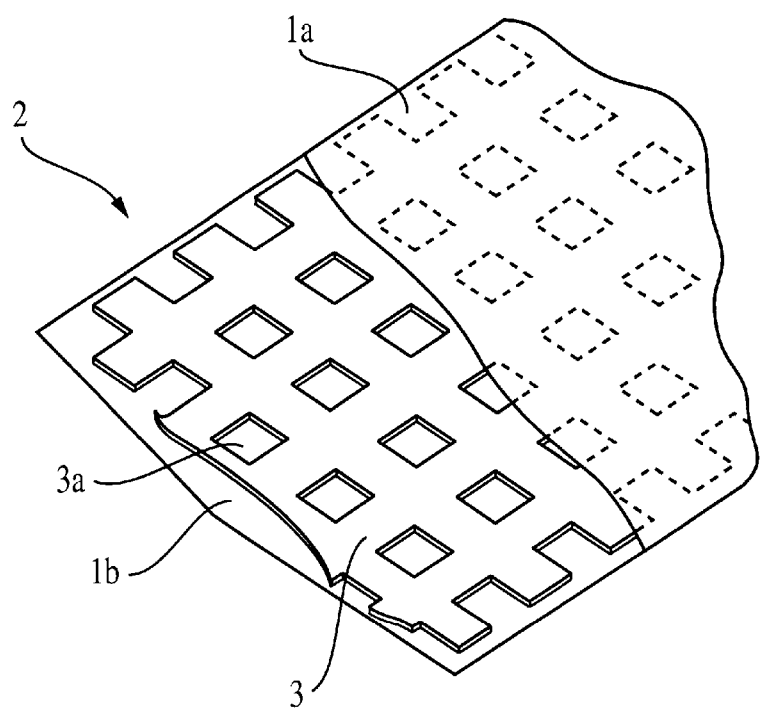
FIG. 1A is a partially exploded perspective view of a conventional electrical circuit coated with insulator sheets.
Figure 1B:
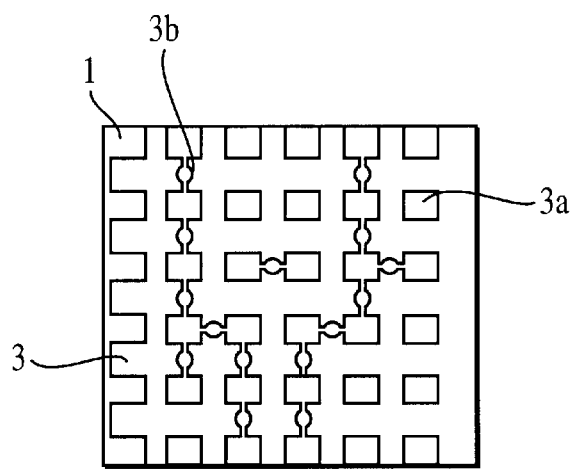
FIG. 1B is a top plan view of the electrical circuit of FIG. 1A when unnecessary paths are cut off.
Figure 2:
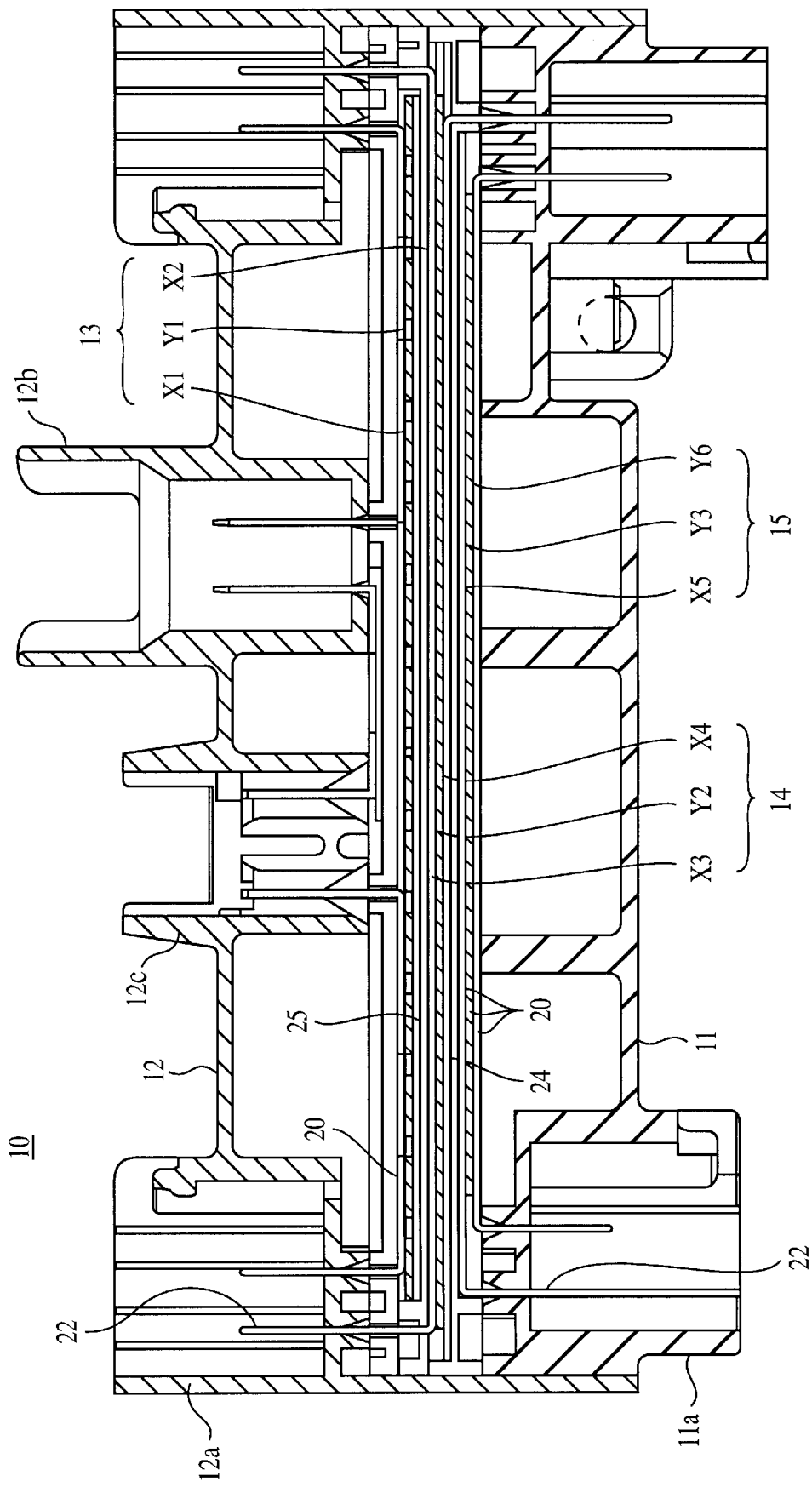
FIG. 2 is a cross-sectional side view of the electrical connector housing according to the present invention.
Figure 3:
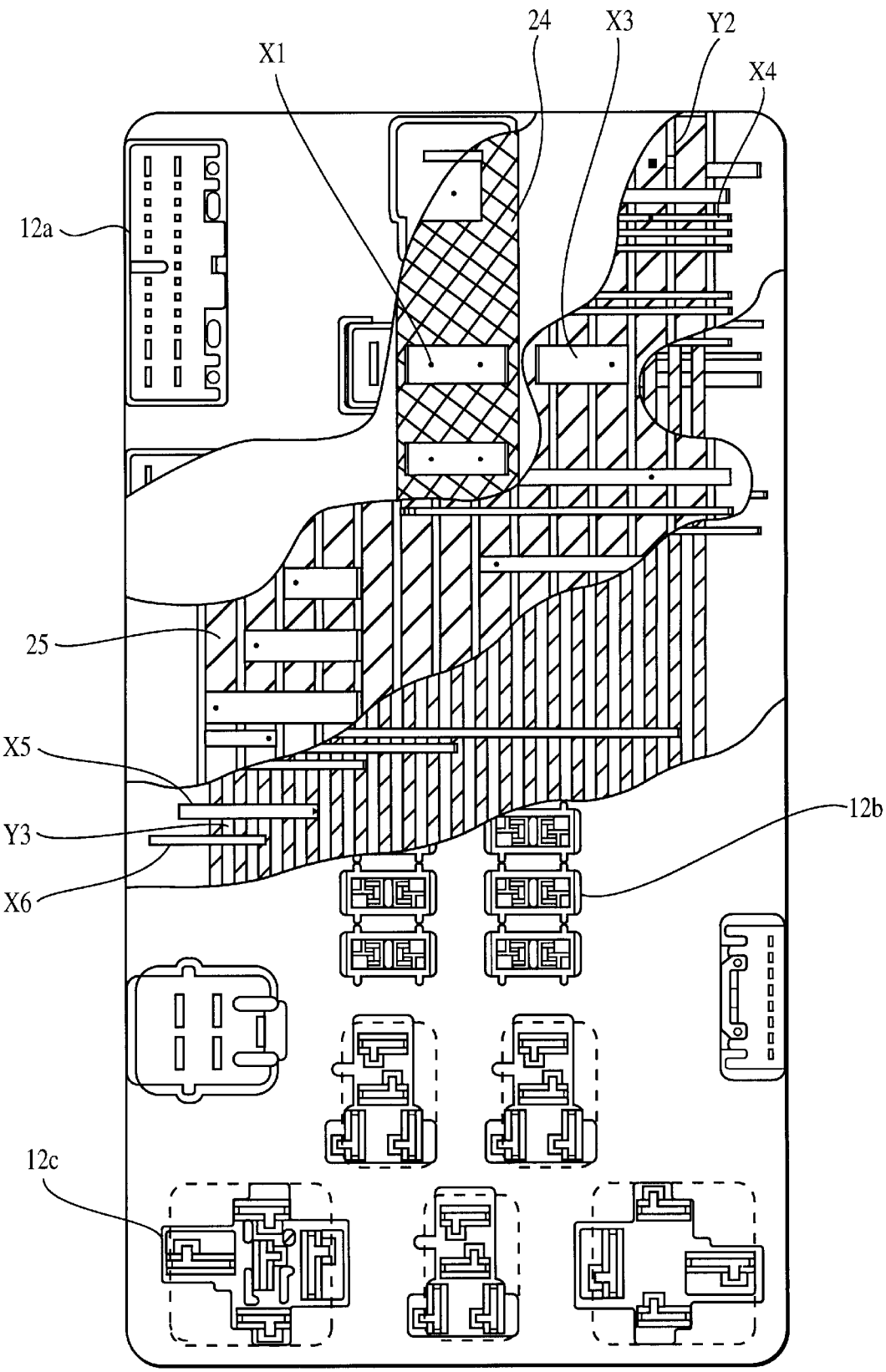
FIG. 3 is a partially exposed top plan view of the electrical connector housing of FIG. 2.

As shown in FIG. 2, an electrical connector housing 10 such as a junction box includes a lower housing case 11 and an upper housing case 12, and contains internal circuits formed of strip-shaped bus bars 20.

The bus bars 20 form, for example, X-directional bus bar layers X1 to X6 in which the bus bars 20 are arranged in parallel at a given interval along the X direction, and Y-directional bus bar layers Y1 to Y3 in which the bus bars 20 are likewise arranged along the Y direction. The X-directional bus bar layers X1 and X2 flank the Y-directional bus bar layer Y1 by their two faces, thereby forming a power-source circuit block 13 having the three layers X1-Y1-X2. Likewise, the X-directional bus bar layers X3 and X4 flank the Y-directional bus bar layer Y2 by their two faces, thereby forming a load-circuit block 14 having the three layers X3-Y2-X4. Further, the X-directional bus bar layers X5 and X6 flank the Y-directional bus bar layer Y3 by their two faces, thereby forming a splice block 15 having the three layers X5-Y3-X6.

Both faces of each bus bar 20 are laminated with insulator resin film or sheets 21 except its end portion which is exposed and folded to form a tab 22 (FIG. 4A). A plurality of bus bars 20 included in one of the X-directional bus bar layers X1 to X6 and the Y-directional bus bar layers Y1 to Y3 have length-side end portions bonded to carriers. In this condition, the X-directional bus bar layers are superposed on the Y-directional bus bar layers, such that the bus bars 20 are arranged in crosswise directions. The cross points P (note FIG. 7) to be connected are clamped by rivets 17 so as to form branched circuits (FIG. 5B). After connection, unnecessary points are removed. Accordingly, the X-directional bus bar layers and the Y-directional bus bar layers can be superposed without an insulator plate being interposed. Instead, the insulator plate is interposed only between the circuit blocks.

The bus bars 20 inserted in one of the X- and Y-directional bus bar layers XI to X6 and YI to Y3 have a specific width: the bus bars used in the power-source circuit block 13 have a broad width so as to form a high current circuit. Those used in the load-circuit block 14 have a medium width so as to form a medium current circuit. Those used in the splice-circuit block 15 have a narrow width so as to form a weak or mini current circuit.

In the above construction, a splice-circuit block 15, a first insulator plate 24, a load-circuit block 14, a second insulator plate 25 and a power-source-circuit block 13 are successively mounted on the lower housing case 11 in that order.

When the bus bars 20 of different circuit blocks are to be connected, a pin 23 made of a conductive metal is provided, and both of its ends are suitably connected to the bus bars 20, for example, by welding (FIG. 6).

As shown in FIG. 2, the lower housing case 11 is provided with first connector-fitting portions 11a whereas the upper housing case 12 is provided with second connector-fitting portions 12a, a fuse-fitting portion 12b and a relay-fitting portion 12c. The connectors, fuse and relay (not shown in the figures), fitting to the above fitting portions, have their terminals arranged at a given pitch. The bus bars 20 are therefore positioned such that their intervals in the X-direction and in the Y-direction correspond to the above pitch. In this manner, the tabs 22 projecting from the bus bars 20 are positioned such as to correspond to the terminal holes of the connectors, fuse and relay.

When mounting the electrical connector housing 10, the preliminarily formed splice-circuit block 15, load-circuit block 14 and power-source-circuit block 13 are successively superposed on the lower housing case 11, with the interposition of the first insulator plate 24 and the second insulator plate 25 between the corresponding circuit blocks. The upper housing case 12 is then placed over this assembly. At the same time, the tabs 22 formed on the bus bars 20 are inserted into the connector-fitting portions, fuse-fitting portions and relay-fitting portions.

In the above construction, the circuits are preliminarily prepared as circuit blocks, such as power-source circuit blocks 13, load-circuit blocks 14 and splice-circuit blocks 15. When an electrical connector housing requiring a high-intensity circuit, e.g. a junction block, is to be constructed, it suffices to assemble these circuit blocks successively in electrical connector housing cases. The assembly efficiency is thus high. Further, when a circuit has to be changed, only the circuit block including the modified circuit needs to be changed. Circuits are thus easily changed. Furthermore, in the X-directional and Y-directional bus bar layers in the same block, the bus bars that are laid out may have the same width. Each circuit block can thus be composed of the bus bars securing a similar electric current intensity flow.

Figure 7:
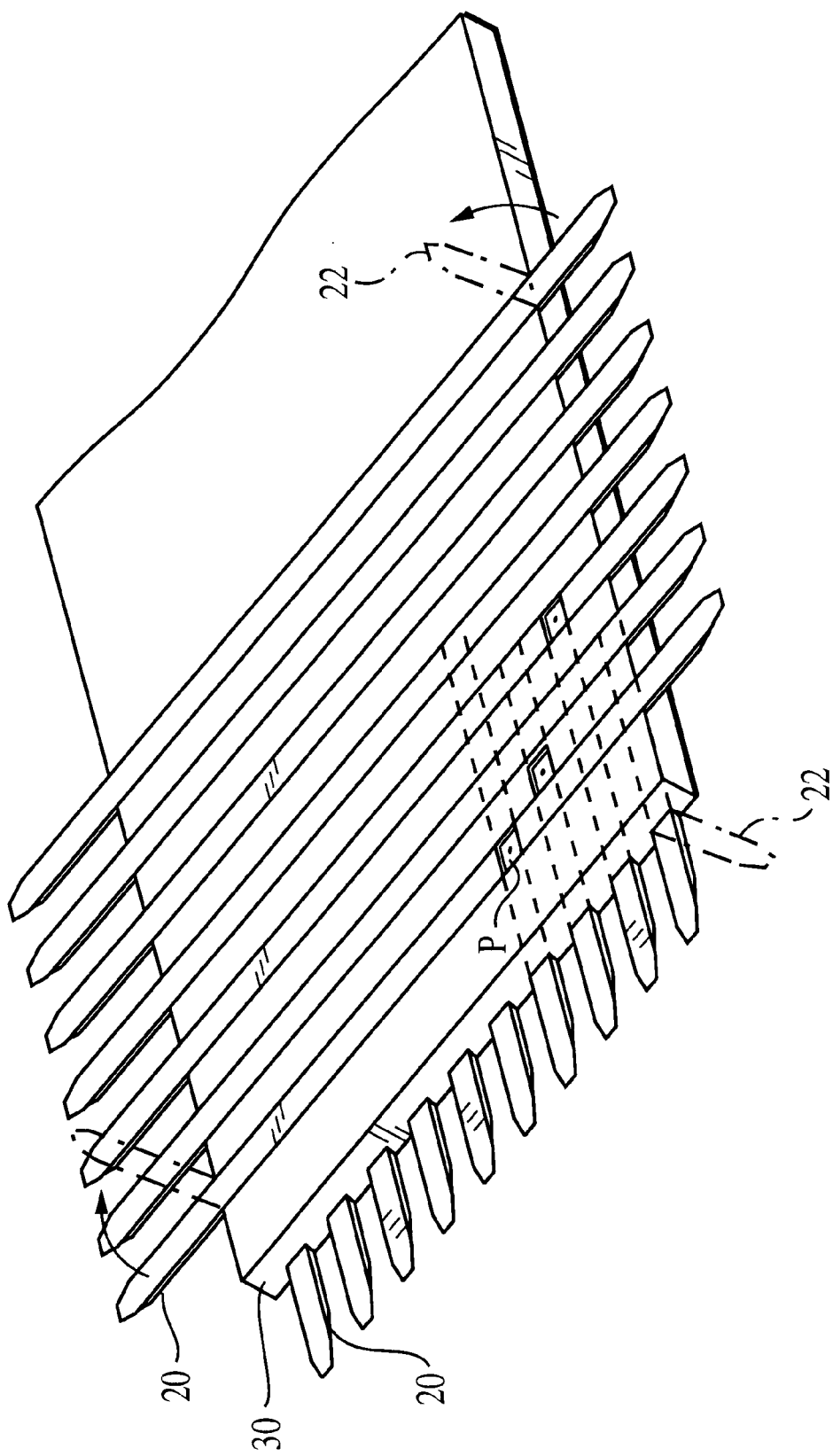
FIG. 7 is a perspective view of a variant bus bar arrangement according to the present invention, where the X-directional bus bars and the Y-directional bus bars are interposed by an insulator plate with connecting holes.

However, the present invention is not limited to the particulars described above. The bus bars may be bonded to one another by welding, instead of riveting. Likewise, instead of laminating the surfaces of each bus bar with insulator films, the X-directional bus bars and the Y-directional bus bars may be arranged in crosswise directions on each face of an insulator sheet or plate 30 (FIG. 7). In such a case, the insulator plate may be provided with openings at the cross points where connections are made. The upper and lower bus bars are then bonded by resistance welding. In the case of three layers X-Y-X, the latter are bonded in pairs of layers by resistance welding.

As described above, the internal circuits of the electrical connector housing contain X-directional bus bar layers in which strip-shaped bus bars are arranged in parallel at a given interval in the X direction, and Y-directional bus bar layers in which strip-shaped bus bars are likewise arranged in the Y direction. The X-directional and Y-directional bus bar layers are then superposed, such that the bus bars in each layer are arranged in crosswise direction to each other. The above layers then form a power-source circuit block, a load-circuit block, a splice-circuit block, etc. These circuit blocks are thus easily formed. Further, when some circuits are to be included into the circuit blocks, it suffices to change the connecting or cutoff positions in the X- or Y-directional bus bars. The circuits can also be changed very easily.

In a connector housing case, the circuit blocks are superposed with an 10 insulator plate interposed therebetween. In this manner, high-intensity internal circuits can be formed easily in an electrical connector housing. Moreover, a circuit configuration can easily be modified by changing circuit blocks to be assembled.

Although the invention has been described with reference to particular means, materials and embodiments, it is to be understood that the invention is not limited to the particulars disclosed and extends to all equivalents within the scope of the claims.

The present disclosure relates to subject matter contained in priority Japanese Application No. HEI 11-216727, filed on Jul. 30, 1999.

What is claimed is:

1. An electrical connector housing comprising at least one housing case including at least one of outwardly projecting connector-fitting portions, fuse-fitting portions and relay-fitting portions, said at least one housing case comprising a plurality of circuit blocks, each of said circuit block including at least one X-directional bus bar layer and at least one Y-directional bus bar layer superposed thereon, said X-directional and Y-directional bus bar layers containing strip-shaped bus bars and an insulator sheet thereon, said strip-shaped bus bars being arranged in parallel at a given interval, respectively in an X direction and in a Y direction perpendicular thereto, said plurality of circuit blocks being superposed on one another with interposition of an insulator plate therebetween such that said bus bars arranged in said X and Y directions form cross points, each of said circuit blocks being electrically connected to each other at desired cross points so as to form branched circuits, said bus bars in said X and Y directions having bent end portions to form tabs, said tabs being contained in said connector-fitting portions, fuse-fitting and relay-fitting portions.

2. The electrical connector housing according to claim 1, wherein said plurality of circuit blocks include at least one power-source circuit block located upstream of fuses, at least one load-circuit block located downstream of said fuses and at least one splice-circuit block unconnected to said fuses, and said busbars of said power-source circuit blocks have a broad width suitable for high current circuitry, said busbars of said load-circuit blocks have a medium width suitable for medium current circuitry, and said bus bars of said splice-circuit blocks have a narrow width suitable for weak or mini current circuitry.

3. The electrical connector housing according to claim 1, wherein said bus bars have first and second faces laminated with a respective insulator resin sheet, wherein said bus bars arranged respectively in said X and Y directions are connected to each other by at least one of riveting and welding at said cross points, and bus bars contained in different blocks are connected to one another by interposition of a pin with two ends in a position perpendicular to said bus bars, and welding said two ends thereto.

4. The electrical connector housing according to claim 2, wherein said bus bars have first and second faces laminated with a respective insulator resin film, wherein said bus bars arranged respectively in said X and Y directions are connected to each other by at least one riveting and welding at said cross points, and bus bars contained in different blocks are connected to one another by interposition of a pin with two ends in a position perpendicular to said bus bars, and welding said two ends thereto.

5. A method of making an electrical connector housing, said method comprising:

providing at least one housing case including at least one of outwardly projecting connector-fitting portions, fuse-fitting portions and relay-fitting portions; said at least one housing case comprising a plurality of circuit blocks;

providing each of said circuit block with at least one X-directional bus bar layer and at least one Y-directional bus bar layer superposed thereon, said X-directional and Y-directional bus bar layers containing strip-shaped bus bars and an insulator sheet;

arranging said strip-shaped bus bars in parallel at a given interval, respectively in an X direction and in a Y direction perpendicular thereto;

superposing said plurality of circuit blocks on one another and interposing an insulator plate therebetween such that said bus bars arranged in said X and Y directions form cross points;

electrically connecting selected ones of said cross points to each other to form branched circuits.

6. The method according to claim 5, further comprising bent end portions of said bus bars in said X and Y directions to form tabs, and inserting said tabs into respective ones of said connector-fitting portions, fuse-fitting and relay-fitting portions.

7. The method according to claim 5, wherein said plurality of circuit blocks include at least one power-source circuit block located upstream of fuses, at least one load-circuit block located downstream of said fuses and at least one splice-circuit block unconnected to said fuses; and providing said busbars of said power-source circuit blocks with a broad width suitable for high current circuitry, said busbars of said load-circuit blocks with a medium width suitable for medium current circuitry, and said busbars of said splice-circuit blocks with a narrow width suitable for weak or mini current circuitry.

8. The method according to claim 5, further comprising laminating first and second faces of each said bus bar with an insulator resin film.

9. The method according to claim 8, further comprising connecting said bus bars arranged respectively in said X and Y directions to each other by at least one of riveting and welding at said cross points.

10. The method according to claim 9, further comprising connecting said bus bars contained in different blocks to one another by interposition of a pin with two ends in a position perpendicular to said bus bars, and welding said two ends thereto.

11. The method according to claim 8, further comprising connecting said bus bars contained in different blocks to one another by interposition of a pin with two ends in a position perpendicular to said bus bars, and welding said two ends thereto.

12. The method according to claim 7, further comprising laminating first and second faces of each said bus bar with an insulator resin film.

13. The method according to claim 12, further comprising connecting said bus bars arranged respectively in said X and Y directions to each other by at least one of riveting and welding at said cross points.

14. The method according to claim 13, further comprising connecting said bus bars contained in different blocks to one another by interposition of a pin with two ends in a position perpendicular to said bus bars, and welding said two ends thereto.

* * * * *